United States Patent [19]

Theus et al.

[11] Patent Number: 5,510,699
[45] Date of Patent: Apr. 23, 1996

[54] VOLTAGE REGULATOR

[75] Inventors: Ulrich Theus, Gundelfingen; Mario Motz, Endingen, both of Germany

[73] Assignee: Deutsche ITT Industries GmbH, Germany

[21] Appl. No.: 449,494

[22] Filed: May 24, 1995

[30] Foreign Application Priority Data

May 31, 1994 [DE] Germany .................... 44 18 988.5
Sep. 3, 1994 [DE] Germany .................... 44 31 466.3

[51] Int. Cl.$^6$ .................... C05F 3/04; C05F 3/16
[52] U.S. Cl. .................... 323/312; 323/313
[58] Field of Search .................... 323/312, 313, 323/315, 316, 273; 327/530, 535, 538, 539, 540

[56] References Cited

U.S. PATENT DOCUMENTS

| | | | |
|---|---|---|---|
| 4,532,467 | 7/1985 | Mensink et al. | 323/316 |
| 4,849,684 | 7/1989 | Sonntag et al. | 323/313 |
| 5,182,525 | 1/1993 | Theus | 330/253 |
| 5,285,148 | 2/1994 | Uhlenhoff et al. | 323/272 |
| 5,349,285 | 9/1994 | Okanobu | 323/312 |

FOREIGN PATENT DOCUMENTS

4242989C1  5/1994  Germany .

OTHER PUBLICATIONS

A copy of the English–language translation of DE424298C1.

Primary Examiner—Matthew V. Nguyen
Attorney, Agent, or Firm—Plevy & Associates

[57] ABSTRACT

A voltage regulator contains a reference which provides a value for comparison by an error amplifier which generates a control signal in response to the deviation of the output to the reference. As many stages of the circuit as possible are connected to fixed potential points. The fixed potential points are fixed with respect to the regulated output voltage. This provides a voltage regulator which is insensitive to interference signals from the unregulated supply voltage. The interference signals from the supply voltage are further buffered by using relatively small capacitors within the circuit, rather than a large external filter means.

21 Claims, 1 Drawing Sheet

VOLTAGE REGULATOR

FIELD OF THE INVENTION

The present invention relates generally to voltage regulators and more particularly, to a voltage regulator having improved RF interference suppression capabilities.

BACKGROUND OF THE INVENTION

Voltage regulators employed to regulate integrated circuit (IC) internal reference voltages or supply voltages are known. One such voltage regulator particularly useful in circuits employing Hall devices, is disclosed in co-pending German Patent Application Number DE 4242989, assigned to the assignee herein. The voltage regulator described therein is advantageous in that no external components are necessary, so that the number of leads of a chip and the susceptibility to electromagnetic interference can be reduced. This is essential if the voltage regulator is used in automotive systems. Through the described arrangement of the first p-channel transistor and the first n-channel transistor, a linear transfer characteristic of the output stage of the voltage regulator is achieved. This linear transfer characteristic results from the superposition of the output currents of the two transistors with quadratic characteristics in the node. The linear transfer characteristic prevents the regulated voltage of the IC from being modulated in the presence of radio-frequency interference. This is particularly important if RF interference with large amplitudes may occur, as is the case in automotive systems, for example. The driver transistor for the output line is an n-channel transistor implemented as a common-source stage.

One disadvantage of the above described prior art voltage regulator is that the dynamic output impedance is high, particularly at high frequencies. This limits the suppression of the effects of RF interference.

Accordingly, it is the object of the present invention to provide a voltage regulator in which RF interference is suppressed more effectively.

This object is attained by providing a voltage regulator of the above kind in which the first fixed potential points is the node. The fixed potential points are at a fixed potential with respect to the regulated output voltage.

SUMMARY OF THE INVENTION

The present invention is a voltage regulator. The voltage regulator contains a reference which provides a value for comparison by an error amplifier which generates a control signal in response to the deviation. As many stages of the circuit as possible are connected to fixed potential points. The fixed potential points are fixed with respect to the regulated output voltage. This provides a voltage regulator which is insensitive to interference signals from the unregulated supply voltage. The interference signals from the supply voltage are further buffered by using relatively small capacitors within the circuit, rather than a large external filter means.

A first p-channel transistor, has the drain electrode coupled to a first supply potential. A second n-channel transistor, has the source electrode coupled to a fixed potential. An output line is coupled to the source electrode of the first transistor. An amplifying means provides a control output signal in response to a voltage potential of the output line and a voltage reference. The gate electrode of the first transistor and the gate electrode of the second transistor are adapted to receive the control output signal. A means for obtaining a difference of current through the first transistor and current through the second transistor is coupled to the drain electrode of the second transistor and to the source electrode of the first transistor.

BRIEF DESCRIPTION OF THE DRAWING

For a full understanding of the present invention, the above objects and further features and advantages of the invention are described in detail in an exemplary embodiment below in conjunction with the drawing, for which.

DETAILED DESCRIPTION OF THE INVENTION

Figure 1:
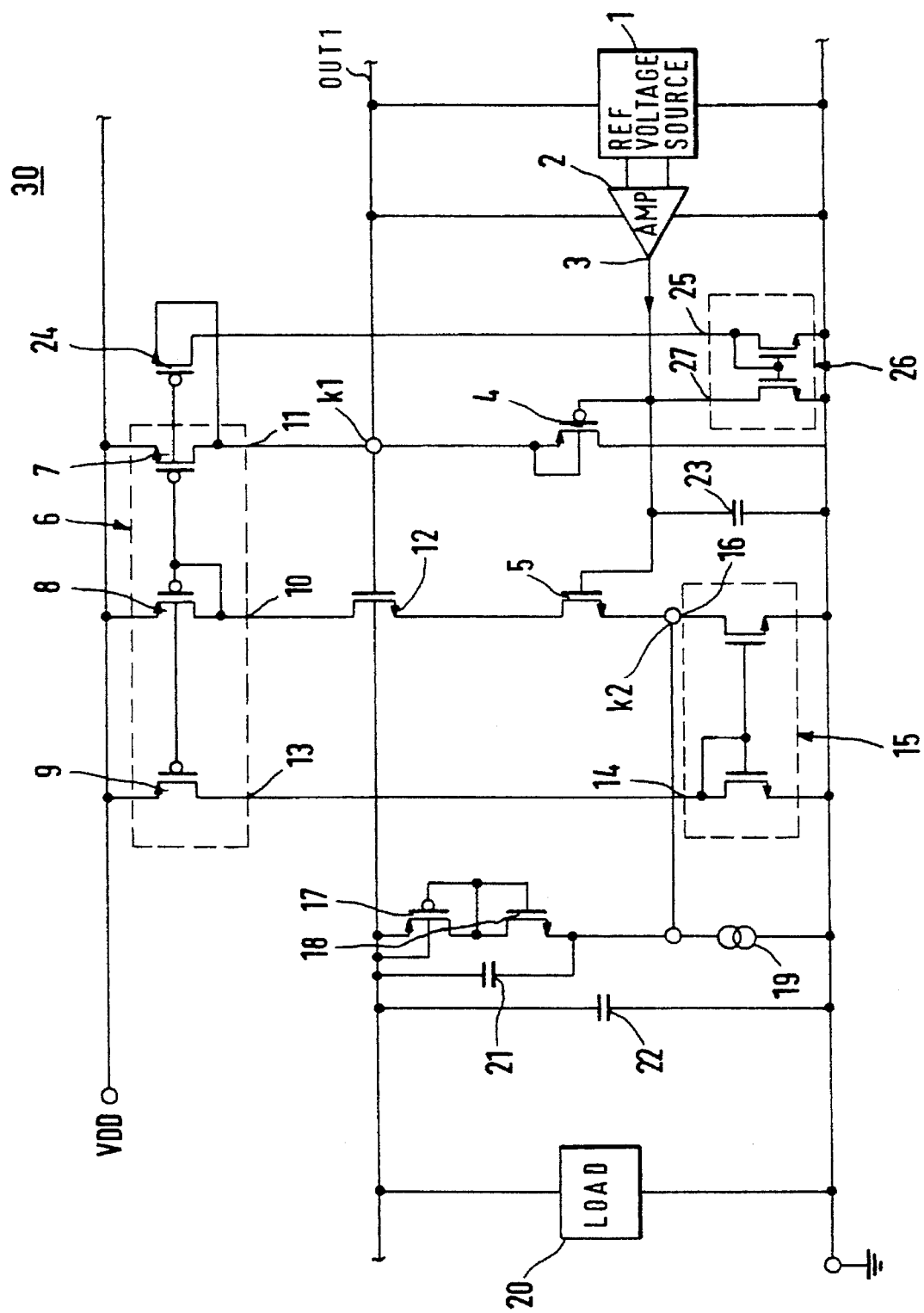
FIG. 1 shows a schematic of an embodiment of a voltage regulator according to the present invention.

With reference now to FIG. 1, there is shown a schematic of a voltage regulator 30 according to the present invention. The source terminal of the first p-channel transistor 4 is coupled to the output line. This p-channel transistor 4 is connected as a source-follower stage. It has a relatively low dynamic input impedance over the entire frequency range, even without feedback. In particular, the dynamic output impedance over the entire frequency range without feedback is lower than the output impedance achieved with an n-channel transistor connected as a common-source stage in accordance with the above prior art. As a result, RF interference is suppressed more effectively in the voltage regulator 30 according to the invention, and the electromagnetic compatibility (EMC) of the voltage regulator 30 is improved. By connecting the p-channel transistor as a source-follower stage, an immediate effect of the driving voltage of the output stage (voltage coming from the output 3 of the error amplifier 2 or the presage) on the output voltage of the voltage regulator 30 is achieved, even without feedback. The coupling of the source terminal of the p-channel transistor 4 to the output line has a lower potential than with a comparable source-follower configuration of an n-channel enhancement-mode transistor. Thus, the error amplifier 2 can drive the p-channel transistor 4 without impairment even at a low operating voltage. For the transistors, enhancement-mode MOS transistors can be used.

The first p-channel transistor 4 is advantageously the driver transistor for the output line. In that case, the suppression of interfering radiation is particularly effective.

In another preferred embodiment of the invention, the switching device comprises a p-channel current mirror 6 whose input is coupled to the drain terminal of the first n-channel transistor 5, and whose first output is connected to the first fixed potential point. The p-channel current mirror 6 superposes the output currents of the first p-channel transistor 4 and the first n-channel transistor 5 with opposite quadratic characteristics in the node in a simple manner. In the current mirror, the transconductance of the first n-channel transistor 5 can be adapted to that of the first n-channel transistor 5. The source terminals of the p-channel current mirror 6 may be connected to a first supply line. This supply line may be connected to a positive supply voltage VDD. Furthermore, a second output 13 of the p-channel current mirror 6 may be coupled to an input 14 of a first n-channel current mirror 15 having its output coupled to the second fixed potential point. This provides a reliable stabilization of the second fixed potential point, and thus of the source terminal of the first n-channel transistor 5 and of the current flowing through this transistor.

The source terminals of the first n-channel current mirror 15 and the drain terminal of the first p-channel transistor 4 may be connected to a second supply line which is negative with respective to the first supply line. The second supply line may be at ground potential. This effectively stabilizes these components and suppresses the effects of interfering radiation.

Advantageously, a second p-channel transistor 17, a second n-channel transistor 18, and a current source 19 are connected in series between the output line and the second supply line, with one terminal of the current source 19 connected to the second supply line, and the other terminal connected to the second fixed potential point. If the second supply line is connected to ground, the current source 19 is grounded and makes available an operating current for the second p-channel transistor 17 and the second n-channel transistor 18, this operating current being independent of the supply voltage. Via these two transistors 17, 18, an operating voltage independent of the supply voltage is set, into which enters the transconductance of the second transistors. Advantageously, the transconductance of these two transistors is adapted to the transconductance of the first p-channel transistor 4 and the first n-channel transistor 5, the current of the current source 19 having to be taken into account in the transconductance considerations. Through this arrangement, a reference-voltage value is made available at the second fixed potential point, and thus at the source terminal of the first n-channel transistor 5. Through a compensation circuit, which contains the first n-channel current mirror 15, the internal resistance at the second fixed potential point is reduced, thus ensuring stability of the reference voltage present there in operation.

To stabilize the operating point at high frequencies, a first capacitor 21 may be connected in parallel with the second p-channel transistor 17 and the second n-channel transistor 18. A second capacitor 22 may be connected between the output line and a fixed potential, particularly ground potential. This second capacitor 22 serves to block supply voltages of the IC with respect to ground, and represents a current buffer for voltage spikes. As a result, the effect of a change in supply voltage, e.g., on the output voltage, particularly at very high frequencies, is further improved. The insertion of the second capacitor 22 in accordance with the invention is possible particularly since the first p-channel transistor 4 is connected as a source-follower stage; with a comparable grounded-source circuit, unwanted oscillation could occur. Particularly advantageously, a third capacitor 23 is connected as a compensating capacitor between the output 3 of the error amplifier 2 and the second supply line. It serves to provide frequency compensation for the voltage regulator 30. It improves the dynamic behavior of the voltage regulator 30 at medium and high frequencies, since it causes the gate voltage of the first p-channel transistor 4 to be kept constant.

In another preferred embodiment of the invention, a detector circuit is provided which senses when the supply voltage is in an under voltage range, and then changes the output of the error amplifier 2 in a predetermined direction. Because of this detector circuit, the voltage regulator 30 will function reliably even of a relatively low supply voltage is applied to the first supply line. This may be necessary when a battery voltage drops. If the detector circuit determines that the battery voltage, e.g., VDD, has dropped to the under voltage range, it will change the output of the error amplifier 2 in a predetermined direction. With a positive supply voltage connected to the first supply line and with the second supply line grounded, the predetermined direction is chosen so that the first fixed potential point, and thus the node connected to the output line, is pulled to a lower potential in comparison with its actual control value. Thus, reliable control of the potential of the node is also possible at a lower supply voltage.

The detector circuit may comprise a third p-channel transistor 24 of the p-channel current mirror 6, and whose source terminal is coupled to the first output of the p-channel current mirror 6, while its drain terminal is coupled to the output 3 of the error amplifier 2. When the supply voltage enters the under voltage range, the third p-channel transistor 24 will turn on and pull the potential of the output 3 of the error amplifier 2 to the second supply line. The latter can be achieved in a simple manner by a second n-channel current mirror 26 in the detector circuit whose input is connected to the drain terminal of the third p-channel transistor 24 and whose output is coupled to the output 3 of the error amplifier 2. Advantageously, at least one cascode stage is provided in at least one shunt arm. Via this cascode stage, isolation from the supply voltage can be provided in the shunt arm.

A voltage regulator 30 of the present invention includes a reference-voltage source 1 and an error amplifier 2, which form a presage. The output 3 of the error amplifier 2 is connected to the gate terminals of a first p-channel transistor 4 and a first n-channel transistor 5. These transistors are enhancement-mode MOS transistors. The first p-channel transistor 4 is the driver transistor for the output line OUT1. Its source terminal is connected to a node k1 of the output line which is at a fixed potential. The source terminal of the first n-channel transistor 5 is connected to a second fixed potential point k2.

There is provided a p-channel current mirror 6 comprising three further p-channel enhancement-mode MOS transistors 7, 8, 9. The input 10 of the p-channel current mirror 6 is coupled to the drain terminal of the first n-channel transistor 5. A first output 11 of the p-channel current mirror 6 is connected to the node k1. The current mirror 6 mirrors the current of the first n-channel transistor 5 onto the node k1. In the node k1, the different of the currents of the first n-channel transistor 5 and the first p-channel transistor 4 is formed. The two transistors 4, 5 have a quadratic current-voltage characteristic. By forming the difference of these characteristics in the node k1, a linear transfer characteristic of the first voltage regulator is achieved. Connected between the first n-channel transistor 5 and the input 10 of the p-channel current mirror 6 is a cascode amplifier 12, which serves to provide isolation from the supply voltage VDD. The source terminals of the p-channel current mirror 6 are connected to the VDD supply line.

A second output 13 of the p-channel current mirror 6 is coupled to an input 14 of a first n-channel current mirror 15. The output 16 of the first n-channel current mirror 15 is connected to the second fixed potential point k2. The source terminals of the first n-channel current mirror 15 and the drain terminal of the first p-channel transistor 4 are connected to the ground line.

A second p-channel transistor 17, a second n-channel transistor 18, and a current source 19 are connected in series between the output line OUT1 and the ground line. The current source 19 is connected to ground and to the second fixed potential point k2. The grounded current source provides a supply-voltage-independent operating current for the series combination of the second p-channel transistor 17 and the second n-channel transistor 18. Via this series combination, an operating voltage is set. The transistors 17, 18 have the same transconductance. With no drive applied to the node k1, operating currents determined by the width ration of the second p-channel transistor 17 and the second n-channel transistor 18 appear in the first p-channel transistor 4 and the first n-channel transistor 5. When the voltage regulator is connected to a load 20, such as a Hall device, stabilization of the node k1 is effected by current mirroring at the n-channel current mirror 15 and at the p-channel current mirror 6. A first capacitor 21 is connected in series with the second p-channel transistor 17 and the second n-channel transistor 18. The capacitor 21 serves to stabilize the node k1 at high frequencies. A second capacitor 22 is connected between the output line OUT1 and ground potential, which capacitor serves to block voltage spikes, particularly at high frequencies. A third capacitor 23 is connected between the output 3 of the error amplifier 2 and ground. It serves to prevent oscillations.

A third p-channel transistor 24 has its gate terminal connected to the gate terminal of the p-channel current mirror 6, and its source and drain terminals are connected to the first output 11 of the p-channel current mirror 6 and to the input 25 of a second n-channel current mirror 26, respectively. The output 27 of a second n-channel current mirror 26 is connected to the output 3 of the error amplifier 2. The source terminals of the second n-channel current mirror 26 are connected to the ground line.

When the supply voltage VDD decreases, the transistor 7 of the p-channel current mirror 6 leaves its saturation region. In that case, the supply voltage VDD is in an under voltage range. As a result, the potential at the source terminal of the third p-channel transistor 24 changes. The third p-channel transistor 24 is designed to turn on when a given under voltage range is reached. The current of the third p-channel transistor 24 is mirrored by the second n-channel current mirror 26 and pulls the potential of the fixed potential point k1 down. Thus, the output line OUT1 is at a lower potential, which can be maintained constance even at a lower supply voltage VDD.

The prestage, particularly the reference-voltage source 1 and the error amplifier 2, and the elements succeeding the output 3 (which form the output stage of the voltage regulator), are connected between the output line OUT1 and ground, so that effective suppression of effects of the supply voltage is provided from the beginning. As a result, interference due to incoming radio-frequency energy or conducted interference is suppressed. Thus, all operating currents between the fixed potential point k1 and ground are discharged, with effects of the supply voltage being effectively suppressed. The presage (not shown in detail), comprising the reference-voltage source 1 and the error amplifier 2, may include a triple band-gap circuit with approximately 3×1.25 V=3.75 V, for example. Thus, in the simplest case, the constant voltage on the output line OUT1 is also 3.75 V. The prestage may also be switched via other feedback networks and control voltages. It is preferably provided with cascodes, so that high open-loop gains of the open loop formed by the presage and output stage can be achieved. In this manner, suppression of effects of the supply voltage is provided at lower frequencies.

It will be understood that the embodiment described herein is merely exemplary and that a person skilled in the art may make many variations and modifications without departing from the spirit and scope of the invention. All such modifications are intended to be included within the scope of the invention as defined in the appended claims.

What is claimed is:

1. A voltage regulator comprising:
   a first transistor of a first conductivity type, having a first electrode, a second electrode and a control electrode, said second electrode coupled to a first supply potential;
   a second transistor of a second conductivity type, having a first electrode, a second electrode and a control electrode, said first electrode coupled to a fixed potential;
   an output line coupled to said first electrode of said first transistor;
   an amplifying means for providing a control output signal in response to a potential of said output line and a voltage reference, said control electrode of said first transistor and said control electrode of said second transistor adapted to receive said control output signal;
   a current difference means for obtaining a difference of current through said first transistor and current through said second transistor, said means coupled to said second electrode of said second transistor and to said first electrode of said first transistor.

2. The device as recited in claim 1 wherein said potential of said output line, which is coupled to said first electrode of said first transistor, is fixed.

3. The device as recited in claim 1 wherein said first transistor is a p-channel transistor.

4. The device as recited in claim 1 wherein said second transistor is an n-channel transistor.

5. The device as recited in claim 1 wherein said current difference means is a current mirror.

6. The device as recited in claim 1 wherein said first transistor drives said output line.

7. The device as recited in claim 1 wherein said current difference means comprises a p-channel current mirror having an input and an output, said input coupled to said second electrode of said second transistor and said output coupled to said output line.

8. The device as recited in claim 7 wherein a second supply potential is coupled to said p-channel current mirror.

9. The device as recited in claim 1 wherein said current difference means comprises a p-channel current mirror having an input, a first output and a second output, said input coupled to the second of said second transistor, said first output coupled to said output line; and a first n-channel current mirror having an output and an input, said output coupled to said fixed potential and said input coupled to said second output of said p-channel current mirror.

10. The device as recited in claim 9 wherein said first supply potential is coupled to said first n-channel current mirror.

11. The device as recited in claim 1 further comprising:
    a third transistor of said first conductivity type, having a first electrode, a second electrode and a control electrode, said first electrode coupled to said output line;
    a fourth transistor of said second conductivity type, having a first electrode, a second electrode and a control electrode, said first electrode coupled to said fixed potential, said second electrode commonly coupled to said control electrode, said second electrode of said third transistor, and said control electrode of said third transistor.

12. The device as recited in claim 11 further comprising a first capacitor coupled between said output line and said fixed potential.

13. The device as recited in claim 1 further comprising a second capacitor coupled between said output line and said first supply potential.

14. The device as recited in claim 1 further comprising a capacitor coupled between said output of said amplifying means and said first supply potential.

15. The device as recited in claim 1 further comprising detecting means for detecting when said supply voltage is below a predetermined level wherein said amplifying means is responsive to said detecting means.

16. The device as recited in claim 11 further comprising a current first coupled between said fixed potential and said first supply potential.

17. A voltage regulator comprising:

a first p-channel transistor having a gate, source and drain electrode and a first n-channel transistor having a gate, source and drain electrode connected in parallel, an error amplifier means having an output, the output commonly coupled to the gate electrode of the first p-channel transistor, and the gate electrode of the first n-channel transistor, the source electrode of the first p-channel transistor coupled to a first fixed potential point, and the source electrode of the first n-channel transistor connected to a second fixed potential point, and a switching device which couples current of the first p-channel transistor and current of the first n-channel transistor into a node, for obtaining a difference of the currents, the node coupled to an output line, wherein the node is the first fixed potential point.

18. The device as recited in claim 17 wherein the first p-channel transistor drives the output line.

19. The device as recited in claim 17 wherein the switching device comprises a p-channel current mirror having an input and a first output, the input coupled to the drain electrode of the first n-channel transistor and the first output coupled to the first fixed potential point.

20. The device as recited in claim 17 wherein the switching device comprises a p-channel current mirror having an input, a first output, and a second output, the input coupled to the drain electrode of the first n-channel transistor and the first output coupled to the first fixed potential point; and a first n-channel current mirror having an input and an output, the input coupled to the second output of the p-channel current mirror and the output coupled to the second fixed potential point.

21. The device as recited in claim 17 further comprising a second p-channel transistor having a source, drain and gate electrode, the source electrode coupled to the first fixed potential; a second n-channel transistor having a source, drain and gate electrode, the source electrode coupled to the second fixed potential point, the gate electrode, drain electrode and the drain electrode of the second p-channel transistor commonly coupled; a current source coupled between the second fixed potential point and a supply line.

* * * * *